US008198527B2

(12) United States Patent
Hofmeister et al.

(10) Patent No.: US 8,198,527 B2
(45) Date of Patent: Jun. 12, 2012

(54) FIELD-DEPLOYABLE ELECTRONICS PLATFORM HAVING THERMOELECTRIC POWER SOURCE AND ELECTRONICS MODULE

(75) Inventors: R. Jon Hofmeister, Portland, OR (US);
Craig V. Lucas, Salem, OR (US); Paul H. McClelland, Monmouth, OR (US);
Marshall Field, Corvallis, OR (US);
Marcus S. Ward, Salem, OR (US)

(73) Assignee: Perpetua Power Source Technologies, Inc., Corvallis, OR (US)

( * ) Notice: Subject to any disclaimer, the term of this patent is extended or adjusted under 35 U.S.C. 154(b) by 800 days.

(21) Appl. No.: 12/316,034

(22) Filed: Dec. 8, 2008

(65) Prior Publication Data
US 2010/0139291 A1     Jun. 10, 2010

(51) Int. Cl.
*G08C 19/16* (2006.01)
*F25B 21/02* (2006.01)
*B23P 11/00* (2006.01)
*H04B 1/02* (2006.01)

(52) U.S. Cl. ... 136/230; 136/205; 455/90.3; 340/870.01
(58) Field of Classification Search ............. 136/292, 136/230; 455/127.1; 340/870.01
See application file for complete search history.

(56) References Cited

U.S. PATENT DOCUMENTS

| 3,554,815 | A | 1/1971 | Osborn |
| 3,900,603 | A | 8/1975 | Rittmayer |
| 5,705,770 | A | 1/1998 | Ogasawara |
| 6,259,656 | B1 | 7/2001 | Kotanagi |
| 6,288,321 | B1 | 9/2001 | Fleurial |
| 6,359,841 | B1 * | 3/2002 | Kotanagi et al. ............. 368/203 |
| 7,400,050 | B2 * | 7/2008 | Jovanovic et al. ............ 290/1 R |
| 7,629,531 | B2 | 12/2009 | Stark |
| 2004/0007050 | A1 * | 1/2004 | Stetter .............................. 73/49.2 |
| 2004/0075167 | A1 | 4/2004 | Nurnus et al. |

(Continued)

FOREIGN PATENT DOCUMENTS

DE         3807633        9/1989

(Continued)

OTHER PUBLICATIONS

Akyildiz et al. "Wireless sensor networks: a survey" Computer Networks 38 (2002) 393-442.*

(Continued)

*Primary Examiner* — Jennifer Michener
*Assistant Examiner* — Magali P Slawski

(57) ABSTRACT

A wrapped thermoelectric power source having an inner and an outer insulator is provided within a housing formed, at least partially, by an upper and lower thermal transfer elements. The thermoelectric power source including a plurality of coupled pairs of thin film materials possessing thermoelectric properties, the pairs disposed on a flexible substrate and electrically coupled in any series/parallel combination, with the flexible substrate wrapped around an inner thermal insulator. The thermoelectric power source may be sized such that at least a portion of an electronics module may be disposed at least partly within the inner thermal insulator. The electronics module is electrically coupled to the thermoelectric power source, and includes components for voltage regulation and/or power conditioning. A mechanical means, connected to both the upper and the lower thermal transfer elements, holds those elements substantially adjacent opposite sides of the thermoelectric power source while preventing thermal shorting between the upper and lower thermal transfer elements. In one aspect, the electronics module further includes applications circuitry such as, but not limited to, one or more of sensors, data storage, signal processing, computational resources and wireless communication circuitry.

20 Claims, 3 Drawing Sheets

U.S. PATENT DOCUMENTS

| | | |
|---|---|---|
| 2004/0094414 A1 | 5/2004 | Engelhardt |
| 2005/0115601 A1 | 6/2005 | Olsen |
| 2005/0139250 A1 | 6/2005 | DeSteese |
| 2005/0252543 A1 | 11/2005 | Stark |
| 2006/0151021 A1 | 7/2006 | Stark |
| 2007/0182362 A1 * | 8/2007 | Trainor et al. ............... 320/101 |

FOREIGN PATENT DOCUMENTS

| | | |
|---|---|---|
| DE | 29723309 | 9/1989 |
| JP | 53-031985 | 3/1978 |
| JP | 11-304960 | 5/1999 |
| JP | 2003-179275 | 6/2003 |
| JP | 2004-104041 | 4/2004 |
| JP | 2004-241657 | 8/2004 |
| JP | 2004-335796 | 11/2004 |
| JP | 2006-086510 | 3/2006 |
| WO | WO2004105146 | 12/2004 |
| WO | WO2006001827 | 1/2006 |

OTHER PUBLICATIONS

European Search Report, PCT/US2007003272, Oct. 30, 2009.

* cited by examiner

FIELD-DEPLOYABLE ELECTRONICS PLATFORM HAVING THERMOELECTRIC POWER SOURCE AND ELECTRONICS MODULE

FIELD OF THE INVENTION

The present invention relates generally to thermoelectric power generation, and more particularly relates to a thermoelectrically powered platform suitable for deployment in the field, and adapted to be internally fitted with at least one of a plurality of electronic modules.

BACKGROUND

Advances in semiconductor manufacturing technologies, systems architecture, and assembly techniques, have enabled the development of physically compact and low-power data storage, signal processing, computational, and communication subsystems capable of significant sensing, information processing and communication tasks.

The capabilities provided by these advances have led to the incorporation of such circuits and subsystems in applications such as, but not limited to, remote sensing, data logging, and communication.

Additionally, the discovery and development of materials having thermoelectric properties provided means for delivering electric power without the use of chemical reactions such as those found in batteries. As is known, the thermoelectric effect, sometimes referred to as the Seebeck effect, can be used to convert temperature differences directly into electricity.

Directly combining a thermoelectric powered unit with advanced electronic systems would be advantageous for remote applications since the time between battery replacements would be extended or even eliminated, thus reducing the requirements for field service and maintenance.

Unfortunately, the physical configurations of conventional thermoelectric power generation devices combined with advanced electronics for sensing, storing, computing, and communicating data are not well suited for small form factor, integrated packages for easy field deployability.

What is needed is an integrated, small-footprint, thermoelectrically powered, platform for remote sensing and/or communication, operable in a wide variety of environmental conditions.

SUMMARY OF THE INVENTION

Briefly, a thermoelectric power source wrapped around an inner thermal insulator is provided within a housing formed at least partially by an upper and a lower thermal transfer element and a second outer thermal insulator. The thermoelectric power source includes a plurality of pairs of thin film material having thermoelectric properties, the pairs disposed on a flexible substrate and electrically coupled in any series/parallel combination, and the flexible substrate wrapped around the inner thermal insulator. The inner thermal insulator of the thermoelectric power source may be sized such that at least a portion of an electronics module may be disposed within the inner thermal insulator opening. The electronics module is electrically coupled to the thermoelectric power source, and includes components for voltage regulation and/or power conditioning. The electronics module may further include resources for wireless communication. A mechanical means, connected to both the upper and the lower thermal transfer plates, hold those plates substantially adjacent opposite sides of the thermoelectric power source while preventing thermal shorting between the upper and lower thermal transfer plates.

In a further aspect, the electronics module further includes applications circuitry such as, but not limited to, one or more of sensors, data storage, signal processing, computational resources and wireless communication circuitry.

In a still further aspect, the electronics module includes means for connecting external "plug-in" modules, such as, but not limited to, one or more of sensors, data storage, signal processing, computational resources and wireless communication circuitry.

DETAILED DESCRIPTION

Figure 1:
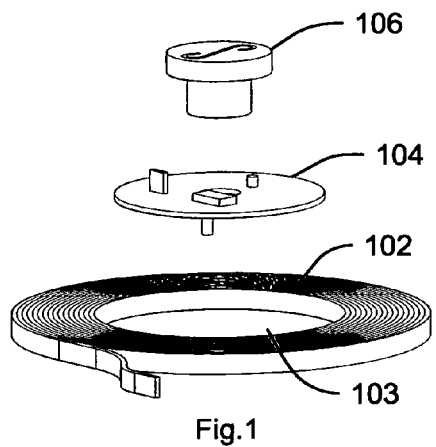
FIG. 1 is an exploded view of internal components, or subsystems, of a self-powered, wireless sensor module in accordance with the present invention.

Generally, a small-footprint, thermoelectrically self-powered platform for remote sensing and/or communication, operable in a wide variety of environmental conditions, includes a thermoelectric power source disposed between thermal transfer elements which form a housing for the power source and electronics module. The thermal elements are thermally insulated from each other. The flexible thermoelectric power source is wrapped around a thermal insulator such that an inner open area is formed, and into which an electronics module may be at least partly recessed.

In one embodiment, the electronics module further includes one or more connectors, or similar connection facilities, which are operable to electrically and mechanically couple to an application circuit. In this way, a plurality of application circuits may be used interchangeably with the field-deployable thermoelectrically powered platform for remote sensing and/or communication of the present invention.

In another embodiment, the electronics module is operable to produce two or more regulated voltage levels, either different levels at different times from a single power supply node, or different levels from each of a corresponding plurality of power supply nodes. In some of these embodiments, the nature of the physical connection between the electronics module and application circuit specifies the manner in which the voltage regulation circuitry is to operate. For example, a specific combination of terminal connections between the electronics module and an applications circuit may indicate the voltage or voltages that are to be supplied to the application circuit.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Thermoelectric effect refers to the conversion of a temperature difference into an electrical potential (i.e. voltage). Thermocouple refers to a device in which a pair of dissimilar materials are connected in series, and which is operable to produce a voltage across its junction as a function of the magnitude of the temperature difference across the device. It is noted that the voltage output of a thermoelectric power source varies with variations in the temperature difference across the device.

The term "electronics module" refers to any electronics subsystem disposed within the housing, such as, but not limited to, any voltage regulation, power management, sensor, data storage, signal processing, computational resources or wireless communication circuitry.

The term "plug-in module" refers to any sensor, data storage, signal processing, computational resources, wireless communication circuitry, or other circuitry that may be used to either provide input to the electronics module or accept output from the electronics module.

Reference herein to "circuit boards", unless otherwise noted, is intended to include any type of substrate upon which circuits may be placed. For example, such substrates may be rigid or flexible, ceramic, flex, epoxy, FR4, or any other suitable material.

The terms chip, integrated circuit, semiconductor device, and microelectronic device are sometimes used interchangeably in this field. The present disclosure uses these terms as they are commonly understood in the field.

Terms such as "upper" and "lower" are used herein to aid in the description of various physical arrangements of components relative to one another, and are not meant to limit embodiments of the present invention to any particular spatial orientation.

Some embodiments of the present invention provide platforms with a thermoelectric power source, and an electronics module disposed therein; and an interface adapted to mechanically receive one or more electronic application modules and further adapted to provide each electronic application module with electrical power. The aforementioned electronic application modules typically include one or more sensor elements along with the circuitry for storing, communicating, and/or otherwise processing information obtained from the one or more sensor elements.

Some embodiments of the present invention provide an autonomous, robust wireless sensor device, environmentally sealed for a long life expectancy. Such units include a high-performance renewable power source, low-temperature heat transfer packaging, power conditioning electronics, RF modules and, in typical cases, integrated sensors. The high-performance renewable power source includes a flexible thermoelectric film that produces reliable energy from temperature differences as low as 1° C. to 2° C., and produces higher voltages than conventional thermoelectric power sources, thereby eliminating, in most applications, the need for voltage boost electronics. Modules may be supplied with either on-module chip sensors and antennas, or with external plug-ins. No moving parts are required by these embodiments.

Illustrative Apparatus

FIG. 1 is an exploded view showing several of the various components, or subsystems, of a self-powered, wireless sensor module in accordance with the present invention. It is noted that various other components, such as those described in greater detail below, are found in a complete assembly. The components shown in FIG. 1 include a thermoelectric power source 102, an electronics module 104, and an upper environmental seal 106. In some embodiments, the environmental seals provide a weather-tight seal, such that the components disposed inside the housing are protected from exposure to performance-degrading components of the atmosphere, or environment, such as, for example, water. It will be appreciated that both an upper and a lower environmental seal may be used in various embodiments of the present invention. Thermoelectric power source 102 includes a plurality of coupled pairs having thermoelectric properties, the pairs disposed on a flexible substrate and electrically coupled in some series/parallel combination, and the flexible substrate wound, or wrapped, around an inner thermal insulator. This arrangement includes a central opening 103. When a temperature difference is provided across thermoelectric power source 102, in a direction substantially orthogonal to the winding direction, electric power may be obtained from thermoelectric power source 102. Those skilled in the art and having the benefit of this disclosure will appreciate that the voltage and current obtainable from thermoelectric power source 102 depend on a number of factors, such as, the magnitude of the temperature difference, the properties of the thermoelectric materials used, the physical size of the coupled pairs, the number of pairs, and the series/parallel configuration of the coupled pairs.

In assembled form, electronics module 104 is electrically coupled to thermoelectric power source 102 such that the voltage developed by thermoelectric power source 102 is coupled across at least the voltage regulation/power conditioning circuitry, which may be referred to as a subsystem, of electronics module 104. In some embodiments, electronics module 104 includes power conditioning and/or voltage regulation circuitry, and one or more connection points for electrically coupling to one or more plug-in modules, which provide one or more desired functions or applications. It is noted that, in various embodiments, electronic module 104 may further include a computational resource such as a microcontroller, as well as wireless communication circuitry. The aforementioned plug-in modules may be configured, by means of any suitable connector, to electrically connect to the connection points of electronics module 104. In some embodiments, the physical implementation of the connection points of electronics module 104 is used to define the physical connector or connection characteristics of the application circuits (i.e., the plug-in modules). In this way, a single apparatus in accordance with the present invention may serve as a platform for a variety of application-specific plug-in modules.

Plug-in modules may electrically couple to electronics module 104 by means of, for example, snap-in connectors; low insertion force connectors, or zero insertion force connectors, twist-lock connectors, or any other suitable connection mechanism. By way of example, and not limitation, further connection schemes between electronics module 104 and a plug-in module include the use of adhesives, which may be dissolvable in a solvent or permanently affixed. Of course, if desired, the application circuit may be permanently attached to electronics module 104 by, for example, soldering. In this configuration, the plug-in connection provides, at least, electrical power from electronics module 104 to the application circuit. It is noted that the application circuitry may include, among other things, one or more sensors along with signal processing or computational circuitry, data storage circuitry, and/or wireless communication circuitry. It will be appreciated that the present invention is not limited to any particular function or functions of the application circuitry.

In alternative embodiments, electronics module 104 includes both the voltage regulation/power conditioning circuitry and the application circuitry. Electronics module 104 may have various components disposed on, and attached to, a single circuit board or similarly suitable substrate; or electronics module 104 may be implemented in an arrangement including two or more substrates on which components are mounted. It is noted that in an implementation with two or more circuit substrates, those substrates may be fastened to each other in any suitable configuration and by any suitable means. In one embodiment, which includes multiple circuit substrates, the individual substrates are arranged substantially parallel to each other rather than at an angle that would increase the height profile of the assembly. By keeping this height profile relatively small, the overall height profile of the fully-assembled field-deployable unit is kept small, thereby increasing the deployment flexibility of these embodiments, and increasing the opportunity for deployment in a wide variety of circumstances.

In some embodiments, the voltage regulation circuitry of electronics module 104 may be configured to sense the output voltage of thermoelectric power source 102 and to record and/or report information regarding fluctuations in the output voltage of thermoelectric power source 102. In some embodiments, the application-specific circuitry may be provided with information regarding fluctuations of the output voltage, and, responsive thereto, may alter its functional mode. For example, if excursions in the output voltage of thermoelectric power source 102 exceed the ability of the voltage regulation/power conditioning circuitry to properly supply the application-specific circuitry with power, then the application-specific circuitry may take one or more predetermined actions, such as, for example, cease one or more of its functions, change the frequency of its operations, or transmit a message indicating that service may be required. Those skilled in the art and having the benefit of this disclosure will recognize that monitoring fluctuations in the output voltage of thermoelectric power source 102 is also a way of indirectly monitoring fluctuations in the temperature difference across the apparatus. Such information may be processed by and/or transmitted from the application-specific plug-in modules.

In some embodiments, the voltage regulation circuitry of electronics module 104 includes circuitry, such as, for example, voltage reference circuitry, to enable determination of the actual voltage output of thermoelectric power source 102. These voltage determinations may be recorded, reported wirelessly through the application-specific plug-in circuitry, and/or used to control one or more reset signals to control the operation of the voltage regulation and/or application-specific circuitry.

In some embodiments, a secondary power source, such as, for example, a battery, or a charge storage subsystem, may be used in conjunction with the output of thermoelectric power source 102. In various ones of these embodiments, circuitry on electronics module 104 may switch between electric power from the secondary power source and the thermoelectric power source based, at least in part, on the fluctuations in, magnitude of, or polarity of, the output voltage of the thermoelectric power source.

In some embodiments, wireless communication resources are included in electronics module 104. In this way, an application plug-in module only requires circuitry for its specific functionality, and it may use the built-in communication resources for wirelessly reporting its sensor readings or other information. In various embodiments, the physical antenna may be part of the plug-in module while the radio circuitry of the communication resource may be disposed on electronics module 104. In further alternative embodiments, one or more antennas may be built-in, or at least partially embedded in upper environmental seal 106, or in any other suitable component or portion of the assembly housing. It is noted that, in various embodiments, the wireless communication resources may include one or more receivers, and/or one or more transmitters. Embodiments of the present invention are not limited to any particular modulation scheme, or frequency band.

Still referring to FIG. 1, upper environmental seal 106 is adapted to provide at least a means for protecting thermoelectric power source 102, and electronics module 104 from the environment when thermoelectric power source 102, and electronics module 104 are disposed within a housing formed in large part from an upper thermal transfer plate and a lower thermal transfer plate. In some embodiments, upper environment seal 106 includes a member extending outwardly toward thermoelectric power source 102, which in the assembled state is coupled so as to hold the upper and lower thermal plates in an attached state.

Figure 2:
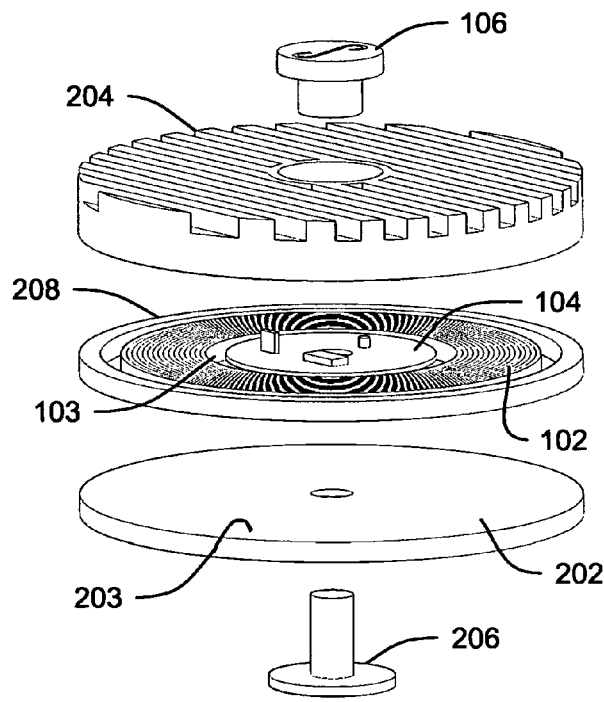
FIG. 2 is an exploded view of internal subsystems, thermal transfer, and environmental seals of a self-powered, wireless sensor module in accordance with the present invention.

FIG. 2 is an exploded view of internal subsystems, thermal transfer, and environmental seals of a self-powered, wireless sensor module in accordance with the present invention. More particularly, a lower environmental seal 206 is shown subjacent a bottom heat transfer plate 202; thermoelectric power source 102 is shown with a thermal insulator 208 disposed around its outer peripheral edge; and electronics module 104 is shown positioned for placement within central opening 103 of thermoelectric power source 102. In various embodiments (see, for example FIG. 4) a second thermal insulator is disposed around the inner peripheral edge of the thermoelectric power source. An upper heat transfer plate 204 is shown above thermoelectric power source 102 and electronics module 104, and below upper environmental seal 106. Bottom heat transfer plate 202 and upper heat transfer plate 204 are typically comprised of a metal, such as, for example, aluminum. In operation, heat may flow in either direction, that is, from bottom heat transfer plate through thermoelectric power source 102 to upper heat transfer plate 204, or vice versa.

In some embodiments, a heat transfer epoxy coating 203 is disposed on at least a portion of the surface of bottom heat transfer plate 202 that faces thermoelectric power source 102. Similarly, a heat transfer epoxy coating may be disposed on at least a portion of the surface of upper heat transfer plate 204 that faces thermoelectric power source 102. It is noted that various combinations of thermal grease and thermal pads may be used to facilitate heat flow to and from thermoelectric power source 102.

In some embodiments, the upper and bottom heat transfer plates 204, 202 are substantially identical. In other embodiments, upper and bottom heat transfer plates 204, 202 are physically different. For example, bottom heat transfer plate 202 may be configured with a flat surface to provide maximum contact area with a heat source, while upper heat transfer plate 204 may be configured with fins to provide maximum surface area for cooling. Similarly, the upper and/or bottom heat transfer plates 204, 202 may be physically configured to provide attachment points to heat sources/sinks.

It is noted that environmental seals 106 and 206 may be provided with recesses respectively in upper and bottom heat transfer plates such that seals 106, 206 are substantially flush when installed. In some embodiments an O-ring is disposed between the environmental seal 106, 206 and the heat transfer plate 204, 202. In some embodiments, environmental seals 106, 206 are tamper-proof once installed in heat transfer plate 204, 202. That is, removal of the seals is detectable. In alternative embodiments one or both environmental seals are locked and require a keyed operation to release or remove them. In some embodiments, environmental seals 106, 206 are threaded and are installed by screwing into heat transfer plates 204, 202 respectively. In other embodiments, a threaded hole is provided through environmental seal 106 and a threaded screw is disposed through seal 106 and screwed into a corresponding threaded portion of environmental seal 206. These seals and screws may be formed from machined plastic. By fabricating such a screw from a relatively non-thermally-conductive material, the danger of thermally shorting the heat transfer plates is reduced.

Figure 3:
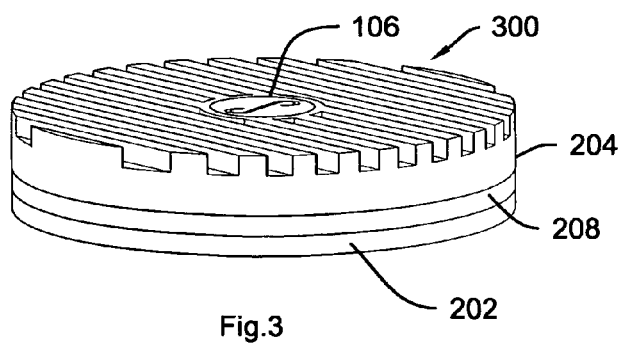
FIG. 3 illustrates a self-powered, wireless sensor module in its field-deployable state, in accordance with the present invention.

FIG. 3 illustrates a self-powered, wireless sensor module 300 in its field-deployable state, in accordance with the present invention. As can be seen in FIG. 3, upper heat transfer plate 204, and bottom heat transfer plate 202, together with thermal insulator ring 208 enclose thermoelectric power source 102 and electronics module 104. Upper environmental seal 106 can be seen seated in upper heat transfer plate 204. It is noted that one function of thermal insulator ring 208 is to prevent thermal shorting of heat transfer plates 204, 202.

In some embodiments, one or more input/output lines are disposed through either or both of the environmental seals 106, 206, or either or both heat transfer plates 202, 204, or thermal insulator ring 208. In this way, direct-wired communication with internal electronic components may be performed. In still other embodiments, an external mechanical reset switch is provided which is operably coupled to reset some or all of the various electronic components within the housing.

In some embodiments of the present invention, an RFID module, or similar circuitry, is included either on the electronics module 104 or on the application-specific plug-in module. In this way, recordation (i.e., data storage) of sensor data can be accomplished via power supplied from the internal thermoelectric power source, and data extraction can be performed with power supplied though an external RF energization field. One advantage of such an arrangement is that no active radio is required to communicate the logged data obtained from on-board sensors. Another advantage of such an arrangement is that power can be wirelessly supplied to internal circuitry without requiring a temperature difference, and without having to physically open the housing to access the recorded data.

Figure 4:
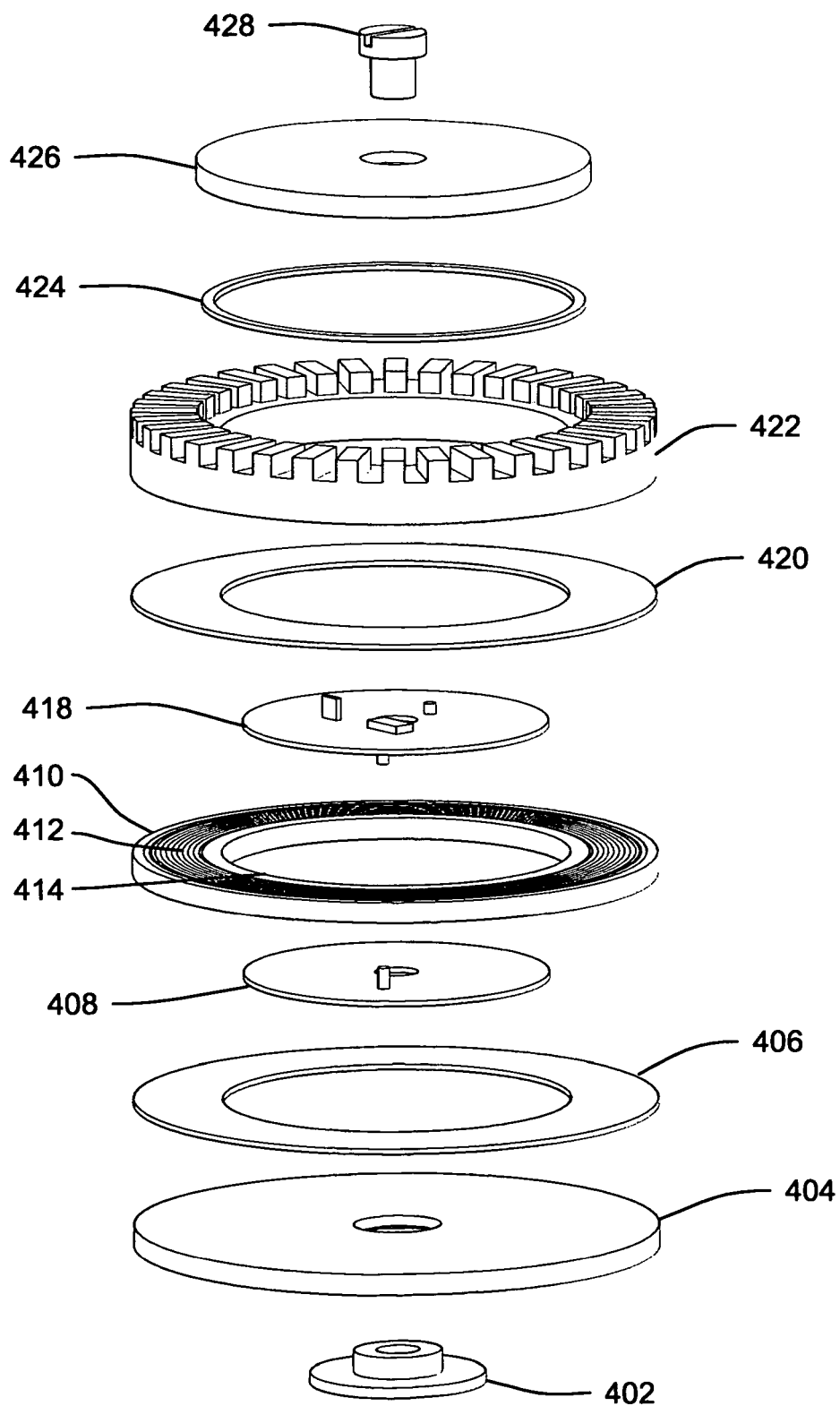
FIG. 4 is an exploded view of an alternative arrangement of a self-powered, wireless sensor module.

FIG. 4 is an exploded view of an alternative arrangement of a self-powered, wireless sensor module 400. A lower isolator 402 is shown subjacent a bottom heat transfer plate 404 which has an opening therein for receiving lower isolator 402. A first annular shaped adhesive layer 406 is disposed between bottom heat transfer plate 404 and a thermoelectric power source 412, which itself is fitted with inner and outer thermal insulator rings 414, 410 as shown. A circuit board 408 with voltage regulation circuitry and a predetermined physical and electrical interface is positioned within the inner diameter of inner thermal insulator ring 414. An application-specific plug-in circuit board 418 is also positioned within the inner diameter of inner thermal insulator ring 414. Circuit boards 408 and 418 are electrically and physically connected to each other in the final assembly of wireless sensor module 400. A second annular shaped adhesive layer 420 is disposed between thermoelectric power source 412 with its inner and outer thermal insulator rings 414, 410 and heat sink 422. In the illustrative embodiment heat sink 422 is finned. A square cut O-ring is fitted within the inner diameter of a central opening of heat sink 422, and an upper isolator 426 is superjacent the square cut O-ring 424. An upper isolator attachment screw 428 fits through the various elements of the described stack and is screwed into a threaded hole in lower isolator 402 to hold the assembly together.

Figure 5:
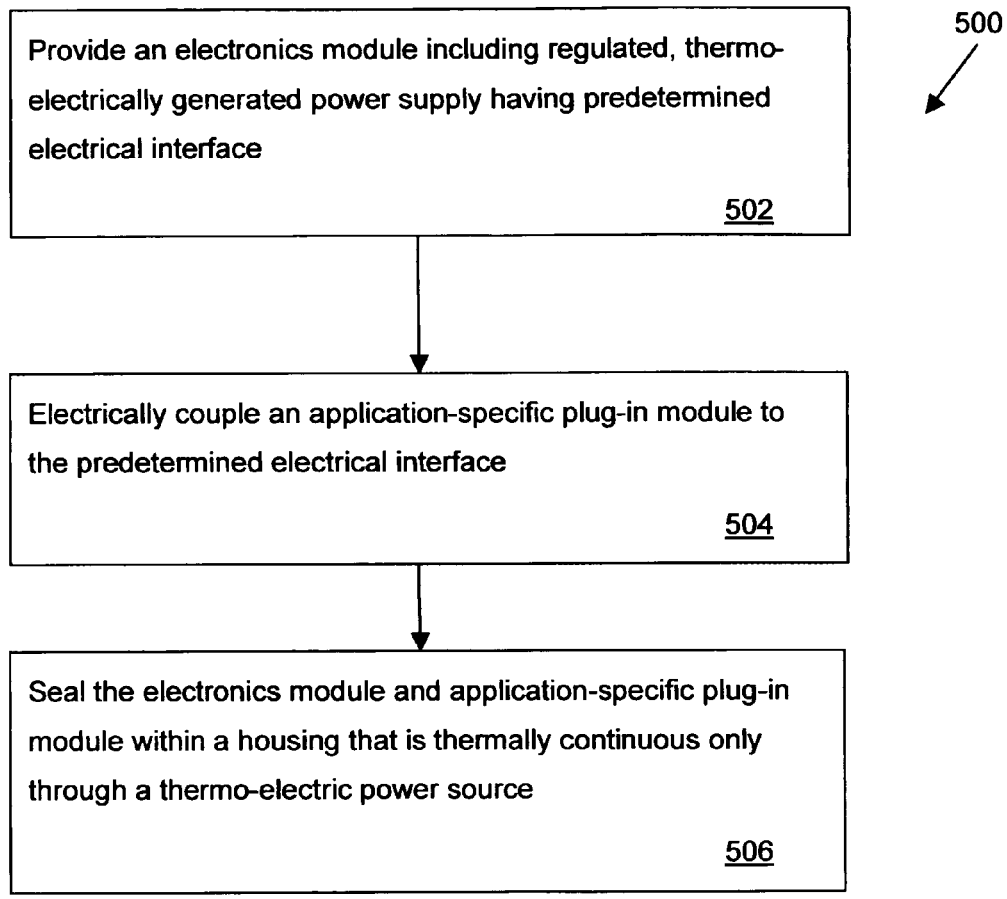
FIG. 5 is a flow diagram of a method in accordance with the present invention.

FIG. 5 is a flow diagram of a method 500 in accordance with the present invention. More particularly, the method includes providing 502 an electronics module, which includes a regulated, thermoelectrically-generated power supply having a predetermined physical and electrical interface; physically and electrically coupling 504 an application-specific plug-in module to the predetermined electrical interface; and sealing 506 the electronics module and application-specific plug-in module within a housing that is thermally continuous only through a pathway including a thermoelectric power source.

In one embodiment, a lightweight, long-lasting, durable, field-deployable, self-powered, wireless sensor assembly in accordance with the present invention includes a thermoelectric power source, a power electronics module coupled to the thermoelectric power source, and a sensor unit coupled to the power electronics module, all disposed within a housing that includes a first heat I/O plate, a second heat I/O plate, a thermal insulator, and a coupling mechanism to hold the first heat I/O plate and the second heat I/O plate in a fixed spatial relationship to each other; wherein the first heat I/O plate and the second heat I/O plate are spaced apart by the thermal insulator, and wherein the first heat I/O plate is thermally coupled to a first side of the thermoelectric power source, and the second heat I/O plate is thermally coupled to a second side of the thermoelectric power source.

CONCLUSION

The exemplary methods and apparatus illustrated and described herein find application in at least the fields of thermoelectric power generation and remote sensing.

Various embodiments of the present invention advantageously provide rugged packaging able to withstand a wide range of environmental conditions, and further provide operational capability over wide temperature ranges that exceed the operational thresholds of most batteries. Further advantages of various embodiments include electrical power delivery within a predetermined voltage range; ease of modifying power levels to match the demands of a wide range of applications; and a small mountable footprint. It will be appreciated that a still further advantage provided by the use of various embodiments of the present invention is reduction or elimination of battery replacement, thereby reducing sensor downtime, labor costs, and battery disposal issues.

It is to be understood that the present invention is not limited to the embodiments described above, but encompasses any and all embodiments within the scope of the subjoined Claims and their equivalents.

What is claimed is:

1. An apparatus, comprising:
a housing adapted to provide a seal for elements disposed therein;
an inner thermal insulator disposed within the housing, the inner thermal insulator having a first shape;
a thermoelectric power source, wrapped around the inner thermal insulator, operable to provide a voltage when a temperature difference is presented across the thermoelectric power source;
an electronics module, disposed within the housing and positioned within the inner thermal insulator, and electrically coupled to the thermoelectric power source, the electronics module adapted to physically and electrically couple to an application-specific plug-in module disposed within the housing; and an outer thermal insulator disposed around an outer periphery of the thermoelectric power source;
wherein the electronics module is operable to provide at least a regulated output voltage;
wherein the housing includes a first thermal transfer element and a second thermal transfer element, each thermally coupled to the other through the thermoelectric power source.

2. The apparatus of claim 1, wherein the thermoelectric power source comprises a plurality of thermocouples disposed on a flexible substrate.

3. The apparatus of claim 2, wherein the first and second thermal transfer elements are comprised of the same material, and the first and second thermal transfer elements have different shapes.

4. The apparatus of claim 3, wherein:
the first thermal transfer element is a heat source and the second thermal transfer element is a heat sink; and
wherein a first material is disposed between the first thermal transfer element and the thermoelectric power source, and a second material is disposed between the thermoelectric power source and the second thermal transfer element, the first and second materials each being selected from the group consisting of heat transfer epoxy, thermal grease, thermal pads, and adhesive.

5. The apparatus of claim 3, wherein:
the first thermal transfer element is a heat sink and the second thermal transfer element is a heat source; and
wherein a first material is disposed between the first thermal transfer element and the thermoelectric power source, and a second material is disposed between the thermoelectric power source and the second thermal transfer element, the first and second materials each being selected from the group consisting of heat transfer epoxy, thermal grease, thermal pads, and adhesive.

6. The apparatus of claim 2, wherein the application-specific plug-in module includes at least one sensor and a wireless communication resource.

7. The apparatus of claim 2, wherein the application-specific plug-in module includes at least one sensor and the electronics module includes a wireless communication resource.

8. The apparatus of claim 2, further comprising data storage circuitry powered from the thermoelectric power source, and a communications circuit powered by an external RF field.

9. The apparatus of claim 2, further comprising data storage circuitry, computational resources, and a wireless communication subsystem, each powered by the thermoelectric power source.

10. The apparatus of claim 2, further comprising an external reset switch disposed on an outer surface of the housing, the reset switch being coupled to at least one of the electronics module and the application-specific plug-in module.

11. The apparatus of claim 2, further comprising a secondary power source.

12. The apparatus of claim 11, wherein the secondary power source comprises at least one battery.

13. A thermoelectric-powered wireless sensor, comprising:
a thermally conductive base heat transfer element;
a thermoelectric power source wrapped around an inner thermal insulator having an annular shape, and further having a top side and a bottom side, a bottom side of a thermoelectric substrate wrap disposed adjacent the base heat transfer element;
an outer thermal insulator disposed at the outer periphery of the thermoelectric power source;
a circuit substrate disposed within the inner thermal insulator;
a power management circuit disposed on the circuit substrate, the power management circuit electrically coupled to the thermoelectric power source;
a wireless communication circuit electrically coupled to the power management circuit;
a predetermined connection mechanism disposed on the circuit substrate;
a sensor circuit electrically coupled to the power management circuit through the predetermined connection mechanism; and
a second thermal transfer element thermally coupled to the thermoelectric power source.

14. The thermoelectric-powered wireless sensor of claim 13, wherein the base heat transfer element and the second thermal transfer element are mechanically coupled to each other by at least one screw, and thermally coupled to each other through the thermoelectric power source.

15. A method, comprising:
providing an electronics module, coupled to a thermoelectric power source, the electronics module having a predetermined physical and electrical interface;
physically and electrically coupling an application-specific plug-in module to the predetermined electrical interface;
locating the electronics module and the application-specific plug-in module within a central opening of the thermoelectric power source; and
sealing the electronics module, and application-specific plug-in module, and the thermoelectric power source within a housing that is thermally continuous through a thermoelectric power source.

16. The method of claim 15, wherein the thermoelectric power source comprises a plurality of thermocouples disposed on a flexible substrate, the flexible substrate wrapped around an inner thermal insulator.

17. The method of claim 16, further comprising providing at least one radio antenna disposed such that a radio signal may pass through the housing.

18. A method of obtaining information, comprising:
deploying an apparatus comprising:
a housing adapted to provide a seal for elements disposed therein;
an inner thermal insulator disposed within the housing, the inner thermal insulator having a first shape;
a thermoelectric power source, wrapped around the inner thermal insulator, operable to provide a voltage when a temperature difference is presented across the thermoelectric power source;
an electronics module, disposed within the housing and positioned within a central opening of the thermoelectric power source, and electrically coupled to the thermoelectric power source, the electronics module adapted to physically and electrically couple to an application-specific plug-in module disposed within the housing; and
an outer thermal insulator disposed around an outer periphery of the thermoelectric power source;
wherein the electronics module is operable to provide at least a regulated output voltage;
wherein the housing includes a first thermal transfer element and a second thermal transfer element, each thermally coupled to the other through the thermoelectric power source;

wherein the apparatus is deployed such that a temperature difference between the first thermal transfer element and the second thermal transfer element is provided.

19. The method of claim 18, further comprising collecting sensor data, and transmitting information, based at least in part on the sensor data, to a remote location.

20. The method of claim 18, further comprising collecting sensor data, and transmitting information, when the electronics module is energized by an external RF field, to a remote location.

\* \* \* \* \*